US008809724B2

(12) United States Patent
Kottilingam et al.

(10) Patent No.: US 8,809,724 B2
(45) Date of Patent: Aug. 19, 2014

(54) STRATEGICALLY PLACED LARGE GRAINS IN SUPERALLOY CASTING TO IMPROVE WELDABILITY

(75) Inventors: Srikanth Chandrudu Kottilingam, Simpsonville, SC (US); Doyle Clyde Lewis, Greer, SC (US); Daniel Anthony Nowak, Greenville, SC (US); Matthew D. Collier, Simpsonville, SC (US); Jian Zheng, Greenville, SC (US); Lawrence James Whims, Simpsonville, SC (US)

(73) Assignee: General Electric Company, Schenectady, NY (US)

( * ) Notice: Subject to any disclaimer, the term of this patent is extended or adjusted under 35 U.S.C. 154(b) by 1496 days.

(21) Appl. No.: 12/185,465

(22) Filed: Aug. 4, 2008

(65) Prior Publication Data

US 2010/0025382 A1    Feb. 4, 2010

(51) Int. Cl.
| | | |
|---|---|---|
| *B23K 9/04* | (2006.01) | |
| *B23K 9/167* | (2006.01) | |
| *B23K 9/23* | (2006.01) | |
| *B23K 26/42* | (2006.01) | |
| *B23K 15/00* | (2006.01) | |
| *B22D 27/04* | (2006.01) | |
| *C22F 1/00* | (2006.01) | |
| *C30B 29/52* | (2006.01) | |
| *C30B 11/00* | (2006.01) | |

(52) U.S. Cl.
CPC ............ *B22D 27/045* (2013.01); *B23K 15/033* (2013.01); *B23K 9/167* (2013.01); *B23K 9/23* (2013.01); *B23K 26/421* (2013.01); *B23K 15/0093* (2013.01); *C22F 1/00* (2013.01); *B23K 2201/001* (2013.01); *C30B 29/52* (2013.01); *C30B 11/005* (2013.01)
USPC ...................................... 219/76.1; 219/76.15

(58) Field of Classification Search
USPC ........... 219/75, 121.64, 121.46, 121.14, 76.1, 219/76.15
See application file for complete search history.

(56) References Cited

U.S. PATENT DOCUMENTS

| | | | |
|---|---|---|---|
| 3,650,635 A | 3/1972 | Wachtell et al. | |
| 4,549,058 A | 10/1985 | DelMastro et al. | |
| 5,160,822 A | 11/1992 | Aleshin | |
| 2003/0116234 A1* | 6/2003 | Santella et al. ............... | 148/437 |
| 2003/0150092 A1 | 8/2003 | Corderman et al. | |
| 2006/0157165 A1* | 7/2006 | Kottilingam et al. ......... | 148/525 |
| 2006/0231535 A1 | 10/2006 | Fuesting | |

FOREIGN PATENT DOCUMENTS

| | | |
|---|---|---|
| DE | 43 27 189 A1 | 2/1995 |
| DE | 196 30 703 A1 | 2/1998 |
| DE | 100 05 874 A1 | 8/2001 |
| EP | 0 638 387 A1 | 2/1995 |
| EP | 1 340 567 A1 | 9/2003 |
| JP | 01-107973 A | 4/1989 |
| JP | 09-94631 A | 4/1997 |
| JP | 2001-232445 A | 8/2001 |
| JP | 2001-232445 A | 8/2001 |
| JP | 2007-506556 A | 3/2007 |
| WO | WO 00/15382 A1 | 3/2000 |
| WO | WO 2009/046735 A1 | 4/2009 |

OTHER PUBLICATIONS

European Search Report; European Application No. 09166580.2; dated Dec. 14, 2009 (6 pgs.).

* cited by examiner

*Primary Examiner* — Henry Yuen
*Assistant Examiner* — Ayub Maye
(74) *Attorney, Agent, or Firm* — Nixon & Vanderhye P.C.

(57) ABSTRACT

Process for reducing cracking in superalloy metal components by selectively growing large single grains during the casting operation at a region where fusion welding will be required.

12 Claims, 2 Drawing Sheets

STRATEGICALLY PLACED LARGE GRAINS IN SUPERALLOY CASTING TO IMPROVE WELDABILITY

BACKGROUND OF THE INVENTION

The present invention relates to hot gas path components in gas turbines made of nickel and cobalt base superalloy castings.

Castings employed in gas turbines are either equiaxed, directionally solidified or single crystal in nature. Many of these cast components require additional fabrication steps to achieve the final product. One of the operations during the OEM (Original Equipment Manufacture) fabrication, or during service repair, is fusion welding.

It is known that superalloys generally have poor weldability. They suffer from liquation and strain age cracking in the heat affected zone (HAZ) of the weldment. In particular, these cracks generally occur at the grain boundaries (in equiaxed and DS grain alloys).

A need exists to minimize or prevent cracking in the heat affected zone (HAZ) of the weldment due to the stringent defect size requirements depending on the stress and temperature experienced by the location during operation. The present invention seeks to satisfy that need.

BRIEF DESCRIPTION OF THE INVENTION

The present invention centers on the discovery that by growing large single grains in locations where down stream fabrication welding will be required, it is possible to essentially eliminate grain boundaries in such locations, and cracking is reduced or eliminated.

The present invention accordingly provides a process for reducing cracking in metal components by selectively growing large single grains during the casting operation at a region where fusion welding will be required. By selectively placing single large grains in the castings at locations where fusion welding is performed during down-stream fabrication steps, cracking in the base metal heat affected zone in superalloys is reduced or eliminated, and elimination of grain boundaries. This aids in meeting design requirements, improving quality, reducing rework and eliminating scrap.

DETAILED DESCRIPTION OF THE INVENTION

Figure 1:
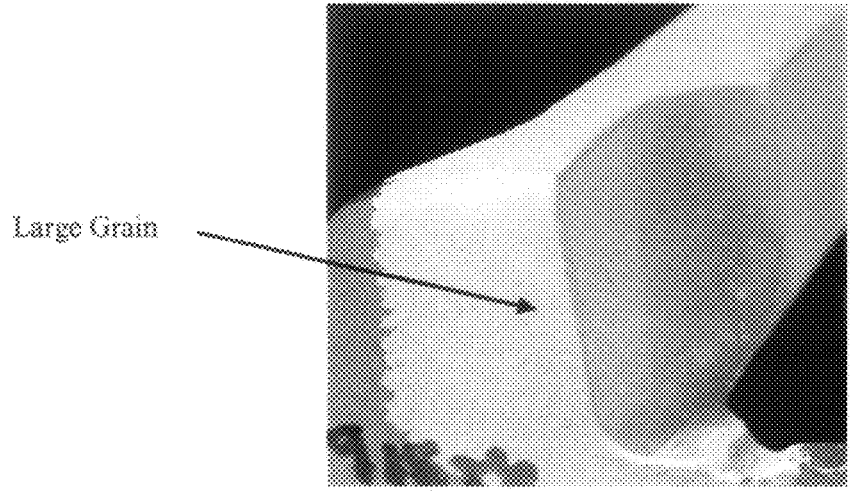
FIG. 1 shows the location of a large single grain in a bucket.

Referring to FIG. 1, there is illustrated a region of the turbine bucket where a large single grain is intentionally grown. This location will undergo fusion welding during down-stream fabrication steps. Traditionally, this location would have many grains and, as a result, there would be many grain boundaries which would be prone to cracking.

Figure 2:
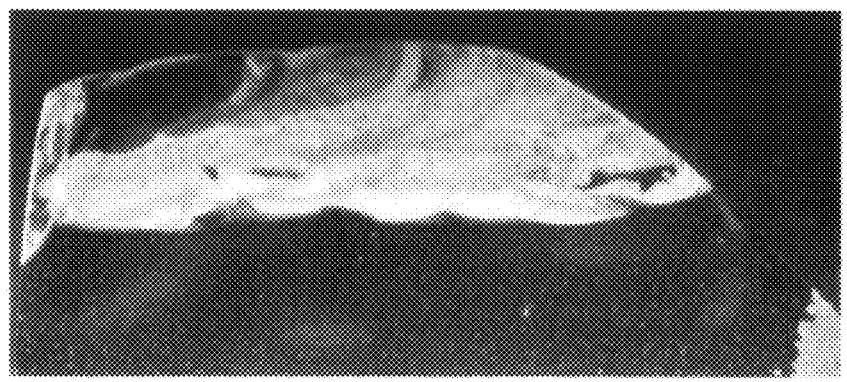
FIG. 2 is a cross-section of a weld made on casting with large single grain (no cracks were present)

FIG. 2 shows the metallographic cross-section of a weld performed on a part with single large grain at the location of fusion welding. No cracks were present in the weld or heat affected zone of the base metal.

Figure 3A:
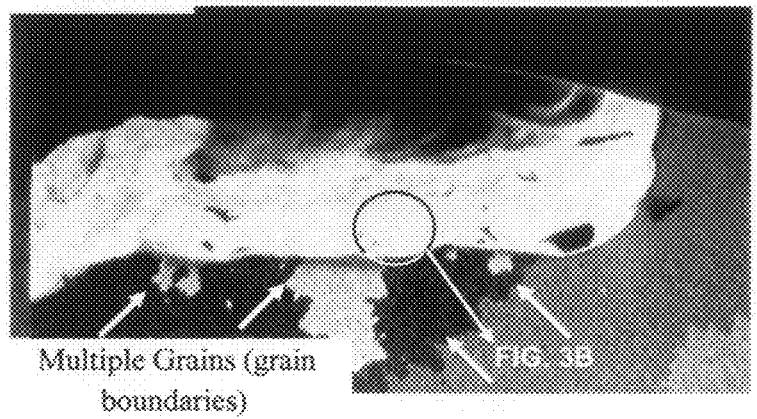
FIGS. 3A and 3B are cross sectional views of a weld made on casting with multiple grains (multiple grain boundaries).
Figure 3B:
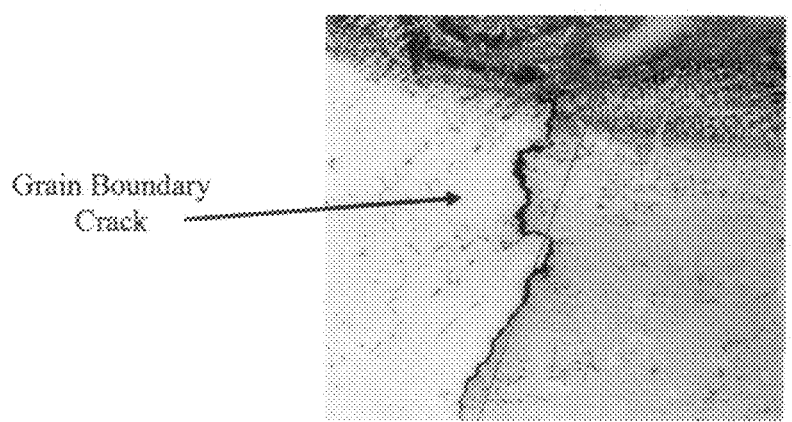

FIGS. 3A and 3B show the metallographic cross-section of a weld performed on a part using the regular casting technique that resulted in multiple grains and thereby multiple grain boundaries. As can be seen in FIGS. 3A and 3B, a crack was present at the grain boundary after fusion welding.

In a preferred aspect, the process of the invention is for reducing cracking in a weld and in a base metal heat affected zone in a superalloy metal component by selectively growing large single grains during the casting operation at a region where fusion welding will be required. Selective growth is achieved by using single crystal selectors (for example 'pig tails'). The single crystal selectors allow only one single grain to proceed to growth during the casting and solidification operation. The selective growth of single grains is achieved using any single crystal casting technique using a grain selector member to achieve growth of a dominant grain into an area of interest.

The fusion welding may be performed on a component or part either at ambient temperature on a component or part that is preheated to a suitable temperature. A typically preheat temperature is in the range of 300° F. to 2200° F.

The fusion welding may be performed using gas tungsten arc welding (GTAW), plasma arc welding (PAW), electron beam welding (EBW) and laser welding/cladding processes. The process can be performed with or without preheating. The fusion welding process may be manual, or may be semi-automatic or automatic.

Typically, a conventional weld filler material is employed in the fusion welding process. The filler material is usually in wire, shim or powder form. The weld filler material is usually selected from a solid solution strengthened superalloy, a gamma prime strengthened superalloy or an alloy used for surface modification to provide specific properties.

The metal component is typically a hot gas path component or part of a gas turbine. Examples are industrial turbines and aero turbines.

The process of the invention is a combination of the directionally solidified casting process and the single crystal casting process. For each of these processes, the part whole is manufactured to be either directionally solidified or single crystal. The part for this invention is cast predominately as a directionally solidified component with the portion of the configuration requiring welding, cast as a single crystal.

The single crystal portion of the configuration is cast using industry standard grain starter techniques. The same logic can be applied to casting with equiaxed (polycrystalline) grain structure where a large grain at a particular location is desired.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A process for reducing cracking in a weld and in a base metal heat affected zone in a metal component, said process comprising the steps of:
   selectively growing large single grains during the casting operation at a region where fusion welding will be required to thereby eliminate grain boundaries in said region where fusion welding will be required; and
   performing fusion welding at said region where large single grains have been grown;
   whereby cracking at said region where large single grains have been grown is reduced or eliminated.

2. A process according to claim 1, wherein said step of selectively growing said large single grains is achieved using a single crystal casting technique that uses a grain selector member to achieve growth of a dominant grain into an area of interest.

3. A process according to claim 1, wherein the fusion welding at said region where large single grains have been grown is performed on a part at ambient temperature.

4. A process according to claim 1, wherein the fusion welding at said region where large single grains have been grown is performed on a part that is preheated to a required temperature.

5. A process according to claim 4, wherein the part is preheated to a temperature in the range of 300° F. to 2200° F.

6. A process according to claim 1, wherein the fusion welding at said region where large single grains have been grown is performed using gas tungsten arc welding (GTAW), plasma arc welding (PAW), electron beam welding (EBW) and laser welding/cladding processes, with or without preheating.

7. A process according to claim 1, wherein a weld filler material is employed and is in wire, shim or powder form.

8. A process according to claim 1 wherein the fusion welding at said region where large single grains have been grown is manual, semi-automatic or automatic.

9. A process according to claim 7, wherein a weld filler material is employed and is selected from the group consisting of a solid solution strengthened superalloy, a gamma prime strengthened superalloy and an alloy used for surface modification to provide specific properties.

10. A process according to claim 1, wherein the metal component is a hot gas path component of a gas turbine selected from the group consisting of industrial turbines and aero turbines.

11. A process according to claim 1, wherein the metal component comprises a superalloy nickel and cobalt base material.

12. A process according to claim 1, wherein the large single grains are located at a region anywhere on the metal component that requires fusion welding.

* * * * *